United States Patent [19]
Fujiwara et al.

[11] 4,068,253
[45] Jan. 10, 1978

[54] PHOTOCONDUCTOR ELEMENT AND METHOD OF MAKING THE ELEMENT

[75] Inventors: Shinji Fujiwara, Minoo; Takuo Shibata, Hirakata, both of Japan

[73] Assignee: Matsushita Electric Industrial Co., Ltd., Japan

[21] Appl. No.: 712,368

[22] Filed: Aug. 6, 1976

[30] Foreign Application Priority Data
Aug. 20, 1975 Japan .................. 50-101400

[51] Int. Cl.² ............ H01L 27/14; H01L 31/00
[52] U.S. Cl. ................................ 357/31; 357/30; 357/16
[58] Field of Search .................... 357/31, 30, 16

[56] References Cited
U.S. PATENT DOCUMENTS 3,800,194  3/1974  Mariyoma .............. 317/235 R
3,900,882  8/1975  Fukai .................... 357/30
3,966,512  6/1976  Nonaka .................. 148/174
4,007,473  2/1977  Nonoka .................. 357/31

OTHER PUBLICATIONS

Berger et al., Solid State Electronics, vol. 18, No. 9, Sept. 1975, p. 785 et seq.

Primary Examiner—Martin H. Edlow
Attorney, Agent, or Firm—Wenderoth, Lind & Ponack

[57] ABSTRACT

This invention relates to a photoconductor element comprising in the following order 1) a material having wider band gap energy than CdTe, 2) a material primarily consisting of CdTe and 3) a material primarily consisting of ZnTe doped with In. The instant material exhibits characteristics in light sensitivity over entire visible light range, and a low level of dark current and a high speed of light response. This invention further relates to a target for image pickup tube employing the element and a method of making the element.

18 Claims, 12 Drawing Figures

PHOTOCONDUCTOR ELEMENT AND METHOD OF MAKING THE ELEMENT

The present invention relates to a photoconductor element and a target of an image pickup tube.

The materials CdS, CdSe and mixed crystal thereof have been frequently used as photoconductor elements. Although these materials have high sensitivity, they have high level of dark current and show slow light response. As for the spectrum sensitivity, they exhibit high sensitivity in the vicinity of wave lengths corresponding to respective band gap energies but show low sensitivity below and above these wavelengths and they do not show sensitivity over entire range of visible light.

As the practical targets for the image pickup tubes, antimony trisulfide ($Sb_2S_3$), lead monoxide (PbO) silicon(Si) and cadmium selenate (CdSe) have been well known. However, the $Sb_2S_3$ target has a low light sensitivity and frequently produces an after-image. The PbO target is expensive because of the complex manufacturing process involved and exhibits a low photoelectric sensitivity for red color. The Si target has a poor resolution because p-n junctions are formed in an array by integrated circuit technology. The CdSe target, although it has a high sensitivity and a low level of dark current, exhibits a somewhat high amount of lag-image.

on the other hand, U.S. Pat. No. 3,900,882 discloses a photoconductive element consisting of a heterojunction having a first layer of a substance primarily consisting of $Zn_{1-x}Cd_xS$, wherein $0 < X < 1$, and a second layer of a substance primarily consisting of $(Zn_{1-y}CdyTe)_{1-z}(In_2Te_3)_z$ wherein $0 < y < 1$ and $0 < z < 1$, which has a high light sensitivity over the entire visible light range particularly in blue light range. However, even this photoconductive element has a somewhat high level of dark current.

In general, if the target for the color television image pickup tube has a high level of dark current, since the dark current further increases as the environmental temperature rises, it is liable to produce color error on its image plane. Accordingly, it is desired to have a photoconductor element for the target which maintains the dark current as low as possible.

It is, therefore, an object of the present invention to provide a photoconductor element and a target for an image pickup tube which shows a high photoelectric sensitivity over the entire visible light range and has a low level of dark current.

It is another object of the present invention to provide a method of making, with high reproducibility, a photoconductive element and a target for an image pickup tube having a low level of dark current.

Figure 1:
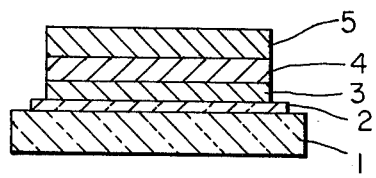
FIG. 1 is a cross-sectional view illustrating an example of photoconductor elements of the present invention.

Referring to FIG. 1, a glass substrate 1 is provided with a transparent conductive film 2. On this film 2, a first layer 3 which is composed of a material having a wider optical band gap than CdTe such as ZnSe is formed. On a first layer 3, a second layer 4 of CdTe is formed, and a third layer 5 of ZnTe doped with In is formed thereon.

Light directed from the side of the glass substrate 1 passes through the glass substrate 1, the transparent conductive film 2 and the first layer 3, and then is transmitted to the second layer 4, wherein almost all visible light is absorbed and generates carriers of electrons and positive holes by optical excitation. Light have a wavelength longer than the range of visible light and not being absorbed by the second layer 4, is transmitted to the outside of the photoconductor element through the third layer 5 or is reflected by the back side of the third layer 5, resulting in absorption by the second layer 4. Therefore the limit for the long wavelength spectrum sensitivity of this photoconductor element is defined by the wavelength absorbable by the second layer 4, so that the limit depends on the absorption coefficient of the second layer 4 and the thickness of the same. On the other hand, a limit for the short wavelength of spectrum sensitivity is defined by a limit for the short wavelength light transmitted to the second layer 4, so that the limit depends on the optical band gap energy of the material mainly composing the first layer 3.

In order to obtain high sensitivity over the entire range of visible light, it is important to make the quantum efficiency nearly unity for the light directed to the second layer 4. As factors which lower the quantum efficiency, there are included recombination centers existing in the second layer 4 wherein carriers are generated by the transmitted light, especially at the incident side, high density of surface states and recombination centers at the interface between the first layer 3 and the second layer 4.

In order to reduce the recombination centers in the former case, conditions in forming the CdTe film for the second layer, especially the temperature of the substrate 1 and the rate of evaporation should be strictly controlled and the deposited film should be subjected to heating whereby defects are reduced, so that the crystal property is improved. In order to resolve the latter problem, it is required that the first layer 3 resemble the second layer 4 is its lattice constant, crystalline structure and coefficient of thermal expansion.

To achieve a low level of dark current, it is necessary to suppress an injection current at a voltage below the breakdown voltage, to within a low level and also to suppress a thermal excitation current in the semiconductor to within a low level.

Considering the polarity of applied voltage, it is presumed that when ZnSe, for example, is employed as the first layer 3 having a band gap energy greater than that of CdTe, injection of positive holes from the transparent conductive layer 2 is prevented by the energy gap between the valence band of ZnSe layer 3 and the conduction band of the transparent conductive layer 2.

Similarly, to prevent the injection of positive holes from the transparent conductive layer, it is effective to use an insulator as the first layer 3. But it is not so as convenient, because when the specific resistance of the insulator is above $10^{13}$ -cm, a considerably high voltage must be applied to avoid overshooting of photoelectric current and besides, it possibly causes an insufficient photoelectric current.

The injection of holes from the transparent conductive layer to the photoconductive layer is also caused by the surface state at the interface between the two layers, which acts to provide recombination centers. To avoid a formation of this surface state, there is provided a first layer 3 resembling the photoconductive layer in its lattice constants, crystalline structure and coefficients of thermal expansion, between the transparent conductive layer and the photoconductive layer, so as to improve the crystal properties of the photoconductive layer.

As the result of above-mentioned points, the characteristics required of a material for the first layer 3 are as follows:

1. Having a band gap energy greater than the CdTe film of the second layer 4 which operates as the photoconductive layer, so as to function as an optical window.

2. Resembling to the photoconductive layer in crystal properties such as lattice constants, crystalline structure and coefficient of thermal expansion.

3. Being capable of suppressing the injection of holes from the transparent conductive layer to the photoconductive layer.

4. Having a specific resistance below $10^{13}\Omega$-cm.

In the following part, considerations concerning the injection of electrons are described.

It is considered that the injection of electrons in the photoconductive element may occur from an electrode of silver paste, etc. which is provided on the third layer 5 of ZnTe doped with In. However, this injection of electrons is prevented by the energy gap between the Termi level and the conduction band of the third layer 5 or by the barrier of the interface.

In the case of a target for an image pickup tube, in which scanning by an electron beam is performed, it is preferred to form a fourth layer of $Sb_2S_3$ on the third layer 5. It is presumed that, thereby some of the electrons emitted by the scanning, when trapped at the surface of the fourth layer, if thermally excited, will enter into the conduction band of the third layer. However, number of such thermally-excited electrons is small. Therefore there is obtained a photoconductive element of blocking type, wherein the injection of carriers from an electrode scarecely occurs.

Dark current in a semiconductor by thermal excitation of electrons and holes, depends on the band gap energy of the semiconductor, for one thing. To reduce dark current, it is preferred that the band gap be wide and the thickness of the layer be small. But since the wider the band gap the lower the sensitivity in the range of red color, there is a limit for the width of the band gap.

In this invention, a material essentially composed of CdTe is used as the second layer 4 which is a photoconductive layer, in order to obtain high sensitivity in the red range. Since CdTe has the narrower band gap compared with the other layers, the second layer had best be made as thin as possible. Further it is preferred that defects of Cd and Te and impurities which form the recombination centers be as few as possible.

Method of Measuring Characteristics

Figure 2:
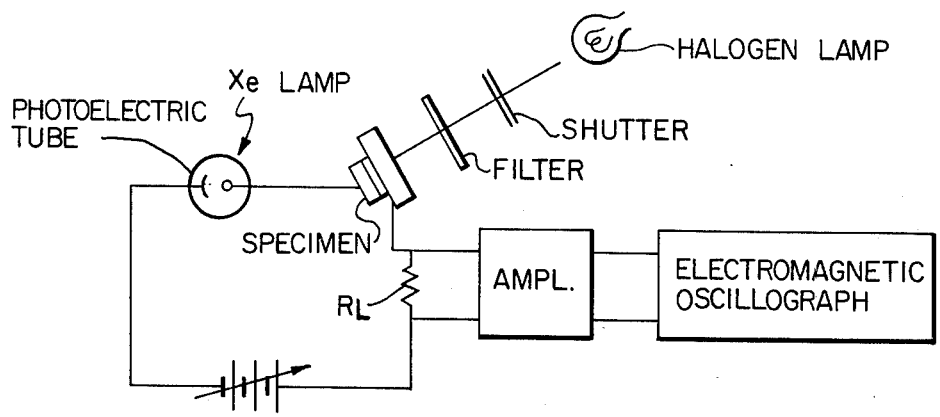
FIG. 2 shows a circuit diagram for measuring a light response characteristic of a photoconductor element.

1. Characteristic of photoconductor element:

A voltage was applied across the transparent conductive film 2 and the silver paste electrode formed on the film 5, to measure spectrum characteristics, dark current, light current and light response speed by a measuring instrument shown in FIG. 2.

a. Spectrum characteristics: An interference filter having a half-amplitude period of 10 – 20 m $\mu$ and a halogen lamp having a color temperature of 3400° K were used to measure the light current at an interval of 20 m $\mu$. The amount of light from a light source through a filter to a sample was measured by a thermopile. The longitudinal axis of the spectrum characteristic chart was scaled in terms of equi-energy sensitivity.

b. Dark current and light current: Current-voltage characteristics and light current-intensity characteristic were measured by an electrometer Model 610C manufactured by Keithley Co.

c. Light response characteristics: The light response of the image pickup tube is principally different from the photoconduction response of the element. For a picture element of an image pickup tube scanned by electron beam, an equivalent circuit without electron beam scan was prepared to evaluate the image pickup tube characteristics by an element. FIG. 2 shows a schematic diagram thereof wherein a photoelectric tube was turned on and off by light pulses having a repetition rate of 60 Hz and pulse width of 2 $\mu$ sec so that an electron beam is caused to re-scan a picture element at 60 Hz. The element was illuminated by a halogen lamp of 3400° K through a filter, and the light response was measured by a camera shutter.

2. Characteristics of the Image pickup Tube:

a. Dark current and light current: A positive voltage was applied to the transparent conductive film while the tube was scanned by an electron beam and a signal current was emitted and measured.

b. Lag-image residual-image and after-image: The lag-image is a transient characteristic of the image pickup tube and it is defined by percent value of the signal current remaining 50 m sec. after the switching from light to dark condition. The residual-image is defined to be a long time lag-image. The after-image is defined by the quenching time for the after-image as measured by a video monitor when the image pickup tube was operated under a standard image pickup condition for a specified time period and then it was operated to pick up a uniformly white background.

The examples of the photoconductor elements of the present invention will now be described.

EXAMPLE 1

Method of preparation: Referring to FIG. 1, the film of ZnSe, 3 is evaporated on the transparent conductive film 2 formed on the glass substrate at a substrate temperature of 150°- 300° C. to a thickness of 0.05 - 0.1 $\mu$m, to define a first layer. Then, the film of CdTe, 4 is evaporated on the ZnSe film 3 at the crucible temperature of 500° - 700° C and at the substrate temperature of 200° C to the thickness of 0.5 $\mu$ m to define a second layer. Next, the film 5 is evaporated on the CdTe film 4 at the substrate temperature of 150° - 250° C to the thickness of 2 $\mu$ m to define a third layer by employing, as an evaporation source material, $(ZnTe)_{1-l} \cdot (In_2Te_3)_l$, for instance $l = 0.01$. Thereafer, the assembly is heat treated under vacuum at 450° - 600° C for 5 minutes - 3 hours. In this arrangement, the value $l$ was varied. The results of this experiment will now be described.

Figure 3:
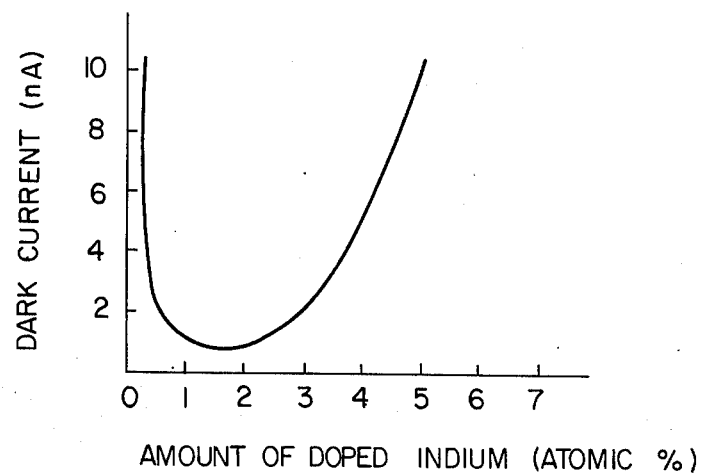
FIG. 3 is a graph showing the relationship between the amount of indium doped in Zn Te film of the Example 1 and the dark current.

FIG. 3 shows a plot of dark current which is produced by applying voltage of 20 volts at an ambient temperature of 25° C while varying an amount of indium in the third layer after the heat treatment, the amount being represented by atomic percentage. The amount of indium is measured quantitatively by a radiometricanalysis method. From FIG. 3, it can be seen that when the amount of indium doped in the third layer lies within the range of from 0.03 to 5 atomic percentage after heat treatment, the dark current may be restricted to less than 10 nA/cm² and that when the amount lies in the range of from 1 to 2 atomic percent, the dark current may be restricted to less than 1 nA/cm². When $l = 0.01$, namely, $(ZnTe)_{0.99}(In_2Te_3)0.01$ is employed as the evaporation source material, the amount of indium in the third layer evaporated was 1.5 atomic percent, and after heat treatment it was 1.9 atomic percent.

Besides, in the aforementioned ranges of the amount of indium, lag-image characteristic were improved as the level of the dark current becomes low.

Where the above-mentioned photoconductor element is employed as a target of an image pickup tube, the film composed of $Sb_2S_3$ is further deposited in a thickness of 0.1 $\mu$ m the film 5 after being subjected to the heat treatment, for instance with the substrate at room temperature, to define a fourth layer and thereafter, the assembly is employed as the target of a vidicon type image pickup tube.

Then, in order to clarify the effect of the first layer of ZnSe, an element which does not have the layer of ZnSe, but which includes the second and third layers formed on the transparent electrodes in the same way as described in the Example 1, is prepared and characteristics thereof are compared with those of the element of the Example 1. The results of the comparative experiments are shown in FIGS. 4 and 5.

Figure 4:
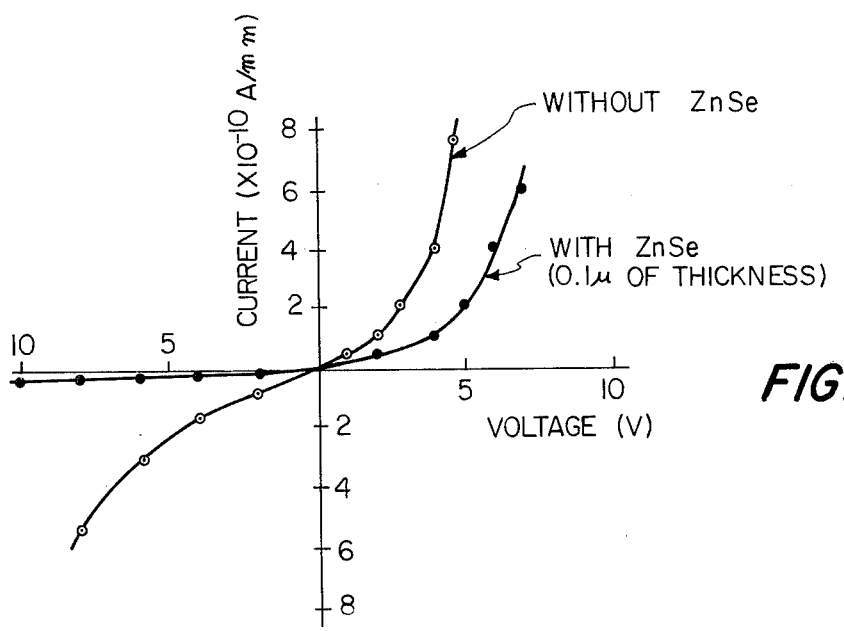
FIG. 4 shows characteristic curves illustrating the relationships between the current and the voltage for the elements with and without the Zn Se film of the Example 1 in accordance with the present invention.

FIG. 4 shows the relationships between the voltage applied to the photoconductor element and the dark current. As can be seen from FIG. 4, the element of the Example 1 is superior to the element not having the layer of ZnSe in rectification and withstandvoltage characteristics. It is presumed that this is due to the fact that the first layer prevents the injection of positive holes from the transparent electrode into the second layer.

Figure 5:
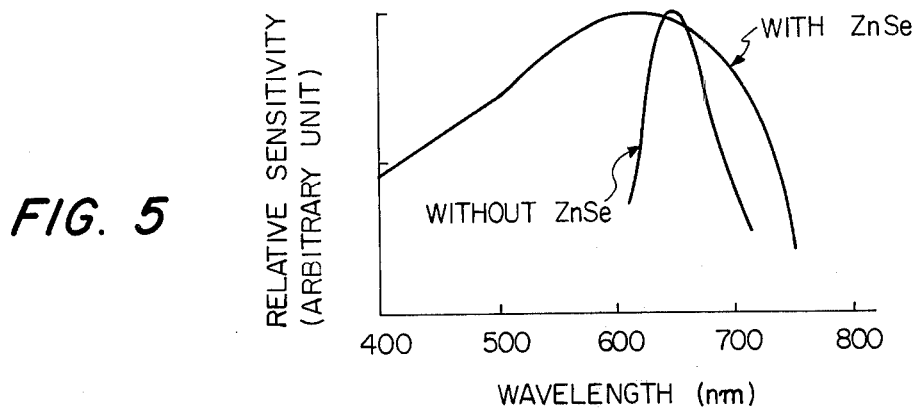
FIG. 5 is a graph showing spectrum characteristics of the photoconductor elements with and without the ZnSe film of the Example 1 in accordance with the present invention.

FIG. 5 shows spectrum characteristics of the elements. As will be seen from FIG. 5, the element of the Example 1, to compare with the element without the first layer of ZnSe, exhibits a high sensitivity over the entire range of visible light, particularly in blue light sensitivity. It is presumed that this is due to the fact that by using ZnSe as the first layer, crystallization of CdTe film which is the second layer is improved and moreover, light sensitivity at blue light, induced at the vicinity of the interface between the first and second layers, is improved because of the decrease of number of surface states at the interface.

Figure 6:
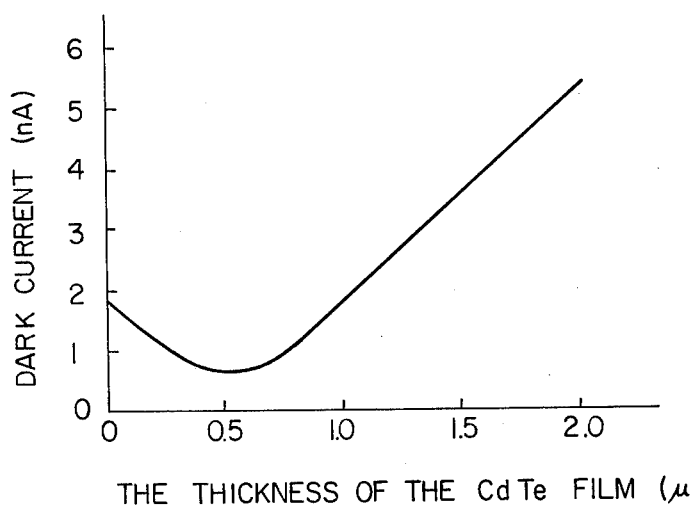
FIG. 6 is a graph showing the relationships between the value of dark current of target for an image pickup tube and the thickness of the CdTe film of the Example 1 in accordance with the present invention.

From the viewpoint of the foregoing, effect of the first layer can be apparently understood. FIG. 6 shows the relationship between dark current and the thickness of the second layer composed of CdTe film 4 for a two-thirds inch Vidicon-type image pickup tube prepared by the element of the Example 1. As will be seen from FIG. 6, the dark current increases as the thickness of the CdTe film increases in the thicnkess range more than 0.5 $\mu$ m. It is presumed that increase of the dark current is caused by a thermally excited generation current. In the enert that the thickness of CdTe film is less than 0.3 $\mu$ m, the voltage which is defined as that producing an after-image under the specified signal current, increases and accordingly, in order to avoid the after-image, a relatively high voltage must be applied to the target. For this reason, it is preferable that the thickness of CdTe film lie in the range of from 0.2 to 0.8 $\mu$ m, so as to restrict the dark current to less than 1na,

EXAMPLE 2

Method of preparation: Referring to FIG. 1, masses of ZnS and CdS are placed in seperate crucible and are evaporated on the transparent conductive film 2 formed on the glass substrate 1 in the form of $Zn_{1-x}Cd_xS$ 3, at a substrate temperature of 100°–250° C to the thickness of 0.05 - 0.1 $\mu$ m, to define a first layer. The value of x of the $Zn_{1-x}Cd_xS$ film may be varied by controlling the crucible temperature for ZnS and CdS repsectively, In this Example, the crucible temperatures for ZnS and CdS and the substrate temperature controlled at 940°, 740° and 140° C., respectively, and $x = 0.1$ was obtained. A film of $Zn_{0.9}Cd_{0.1}S$ was, therefore, formed on the glass substrate as the first layer. Then, a film of CdTe is evaporated on the first layer to a thickness of 0.5 $\mu$ m in the same way as described in Example 1. Next, the third layer is evaporated on the second film at the substrate temperature of 210° C to the thickness of 2 $\mu$ m by using the material $(ZnTe)_{0.99}(In_2Te_3)_{0.01}$ as evaporation source material. Thereafter, the assembly is heat treated under vacuum at 300°–700° C. for 5 minutes - 3 hours. Where the photoconductive element is employed as a target of image pickup tube, the film composed of $Sb_2S_3$ is further deposited on the third layer after the heat treatment, for instance, at a substrate temperature of room temperature, to provide a fourth layer having a thickness of 0.1 $\mu$m.

For this arrangement, the result of the experiment for the composition $(Zn_{1-x}Cd_xS)$ with varying values of x will now be described.

Figure 7:
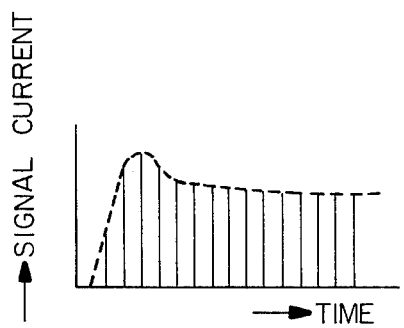
FIG. 7 shows a characteristic curve illustrating the rising characteristic of the light response.

Characteristics of the element:

1. Relation to light response characteristic: from the moment at which light is impinged on the element to the formation of a steady state, as measured by the circuit described in connection with the method of measuring charcteristics, an overshoot is generally observed as shown in FIG. 7, when the applied voltage is low. As the applied voltage increases, the overshoot decreases and eventually is extinguished and the signal current tends to saturate. Moreover, as the intensity of radiation to the element increases, the voltage which extinguishes the overshoot increases. (Hereinafter this voltage is referred as knee voltage). Accordingly, this applied voltage should be predetermined to the level at which the overshoot does not take place.

Figure 8:
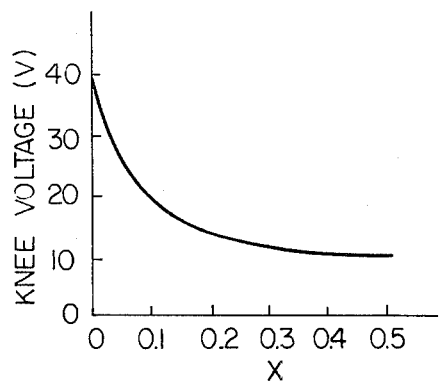
FIG. 8 is a graph showing the relationship between the value of $x$ for $Zn_{1-x}Cd_xS$ and the voltage for quenching afterimage (the knee voltage).

FIG. 8 shows a plot of the knee voltage for varying value of x under the constant signal current of 400 nA. It is seen from FIG. 8 that as $x$, namely amount of cadmium, increases, the knee voltage becomes lower.

Figure 9:
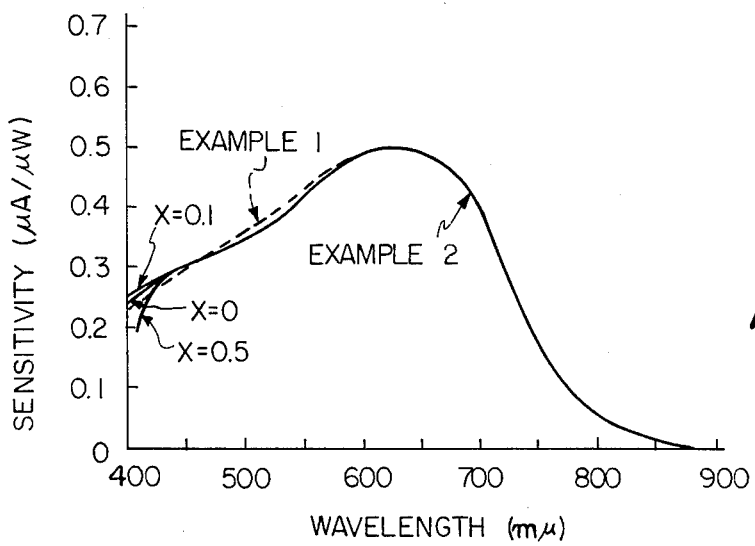
FIG. 9 is a graph showing spectrum characteristics of the photoconductor elements.

2. Relation to the sensitivity for blue light: FIG. 9 shows spectrum characteristics for varying values of $x$. The sensitivity for blue light around 400m $\mu$, when $x = 0$, is rather low because the overshoot remains a little and exhibits a maximum sensitivity as X increases and the overshoot is completely extinguished. When $x$ is further increased, the sensitivity again decreases because the absorabing end of $Zn_{1-x}Cd_xS$ exceeds 400m$\mu$ and transmission ratio of light is lowered. For the reason, upper limit of value $x$ is necessarily determined. The absorption edge wavelength$\lambda$ i 360 m $\mu$ when $x = 0.1$, 380 m $\mu$ when $x = 0.2$ and 400 m $\mu$ wwhen $x = 0.3$.

Characteristics of Target of Image Pickup Tube:

Table 1 shows the characteristics of a target for two-thirds inch image pickup tube prepared by forming the fourth layer composed of $Sb_2S_3$ on the element described above, with varying values of x. The target voltage was maintained at 20 volts.

Table 1

| X Characteristics | 0 | 0.1 | 0.2 | 0.3 | 0.5 |
|---|---|---|---|---|---|
| Dark current(nA) | 0.9 | 0.8 | 0.8 | 1.0 | 1.5 |
| Lag-image(%) | 20 | 12 | 12 | 14 | 16 |
| Blue sensitivity(nA) | 18 | 22 | 22 | 20 | 16 |
| After-image | a little* | None | None | None | None |

*No after-image at target voltage of 40V.

It is seen from the Table 1 that when $x = 0.5$ blue sensitivity is lowered because the band gap becomes narrower due to increasing of cadmium and short wavelength is absorbed by the first layer, and when $x = 0$, as can be seen from the FIG. 7, the knee voltage increases, so that an after-image is liable to occur. The lower limit of value x is determined in consideration of this after-image.

As will be seen from the foregoing description, as for the value of $x$, the preferable range if from 0.1 to 0.3 and particularly the optimum range is from 0.1 to 0.2.

Where the photoconductive element is employed as a target of an image pickup tube, the film composed of $Sb_2S_3$ is further provided as the fourth layer, as described in the Examples 1 and 2. In order to clarify the effect of this fourth layer, a target for two-thirds inch image pickup tube which has not the fourth layer is prepared and a comparison of characteristics between this target and those of Examples 1 and 2 is made. The results of the comparative experiment are shown in Table 2.

Table 2

|  | EXAMPLE 1 | | EXAMPLE 2 | |
|---|---|---|---|---|
|  | With $Sb_2S_3$film | Without $Sb_2S_3$film | With $Sb_2S_3$film | Without $Sb_2S_3$film |
| Target voltage | 18 | 18 | 20 | 20 |
| Dark-current(nA) | 0.5 | 1.5 | 0.8 | 2.0 |

Table 2-continued

|  | EXAMPLE 1 | | EXAMPLE 2 | |
|---|---|---|---|---|
|  | With $Sb_2S_3$film | Without $Sb_2S_3$film | With $Sb_2S_3$film | Without $Sb_2S_3$film |
| White sensitivity ($\mu$A/lm) | 2750 | 3000 | 3100 | 3500 |
| Blue sensitivity ($\mu$A/$\mu$W) | 0.23 | 0.30 | 0.27 | 0.35 |
| Lag-image(%) (after 3 fields) | 8 | 30 | 12 | 40 |
| Residual-image(sec.) (10 lux, radiated during 1 minute) | None | a little | None | a little |
| After-image (10 lux, radiated during 1 minute) | None | a little | None | a little |
| Resolution (number of lines) | 610 | 610 | 610 | 610 |

It is seen from the Table 2 that the fourth layer composed of $Sb_2S_3$ is preferable in terms of dark current, lag-image, reesidual-image and after-image, except for decrease of sensitivity, for the target of the image pickup tube. It is presumed that the layer composed of $Sb_2S_3$ constitutes a structure which can prevent electron beam from directly flowing into the semiconductor.

The foregoing explanation applies the target for the image pickup tube when of the type in which the third layer on the fourth layer is scanned by electron beam to apply a voltage to the first, second and third layers and in cooperation with a potential applied to the transparent conductive film. However, with the target of the type in which a voltage is applied between the transparent conductive film and a silver paste electrode formed on the film opposite the glass substrate, the structure which can prevent the electron beam flow may be constituted without the $Sb_2S_3$ layer, so that the layer is not always necessary.

A, comparison between he elements of Example 1 and 2 will now be made, illustrating Table 1 and FIG. 9. Differences in characteristics resent from the difference of materials of the first layer, namely, the materials being ZnSe and $Zn_{0.9}Cd_{0.1}S$ in the Examples 1 and 2. The target which employs $Zn_{0.9}Cd_{0.1}S$ having a relatively high specific resistance, requires a high level of target voltage. Furthermore, the element of Example 2 exhibits poor characteristics for dark current and lag-image. It is presumed that this results from the fact that the junction between $Zn_{0.9}Cd_{0.1}S$ layer and the second layer of CdTe is inferior to that between ZnSe layer and the second layer. However merit in using $Zn_{0.9}Cd_{0.1}S$ layer resides in the fact that the blue light sensitivity increases because of the increse of blue light transmission at around 400 nm wavelength, as can be seen from the Table 1 and FIG. 9. Accordingly, the element of the Example 2 is suitable for use in a target for a color image pickup tube.

In the Examples 1 and 2, the film composed of CdTe is used as the material of the second layer. The layer, however, is not always necessary to have a stoichiometric composition such that mole ratio of Cd to Te is precisely equal to one. Even if mole ratio of Cd to Te differs from the stoichiometric ratio by about 10 percents, this difference may be rectified by the heat treatment performed after the evaporation.

Figure 10:
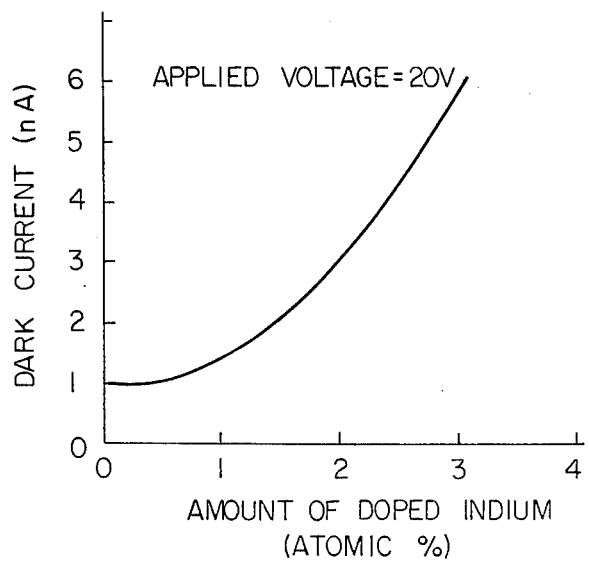
FIG. 10 is a graph showing the relationship between the amount of indium doped in a Cd Te film of the Example 1 and the dark current of the photoconductor element.

FIG. 10 shows the relationship between an amount of indium doped in CdTe film of the second layer and the dark current of the element. Voltage applied to the element is 20 volts.

As for the method of doping indium into the CdTe film, solid soluions of CdTe having varying concentrations of indium are used as the evaporation source material and then the mixture thereof is evaporated upon the first layer. The amount of indium in thus formed layer is quantitatively measured by a radiometric-analysis method after the heat treatment.

It is seen from FIG. 10, when the amount of indium doped in the CdTe film is less than one atomic percent, almost the same level of dark current and characteristics in light sensitivity and response as those of the element of the Example 1 which has the CdTe film without doping of In, may be obtained.

in the Examples described above, indium is doped as an impurity in the second layer composed of CdTe. However, the materials of group III of the periodic system such as gallium and aluminum may be also adopted as the impurity.

Although ZnSe and $Zn_{1-x}Cd_xS$ are used in the Examples 1 and 2, as the materials having a wider band gap than CdTe, $ZnS_{0.7}Se_{0.3}$, $CdS_{0.5}Se_{0.5}$ may be also used as the material which meets to the requirement set forth in the beginning of the description of the preferred embodiment of the present invention.

Then, in order to clarify the effect of using $ZnS_{0.7}Se_{0.3}$ and $CdS_{0.5}Se_{0.5}$, the elements including $ZnS_{0.7}Se_{0.3}$ and $CdS_{0.5}Se_{0.5}$ as the first layer are prepared for use in Examples 3 and 4, respectively. In Examples 3 and 4, a second film composed of CdTe, a third film composed of An, In, Te and a fourth layer composed of $Sb_2S_3$ are formed in the same way as described in Examples 1 and 2.

Figure 11:
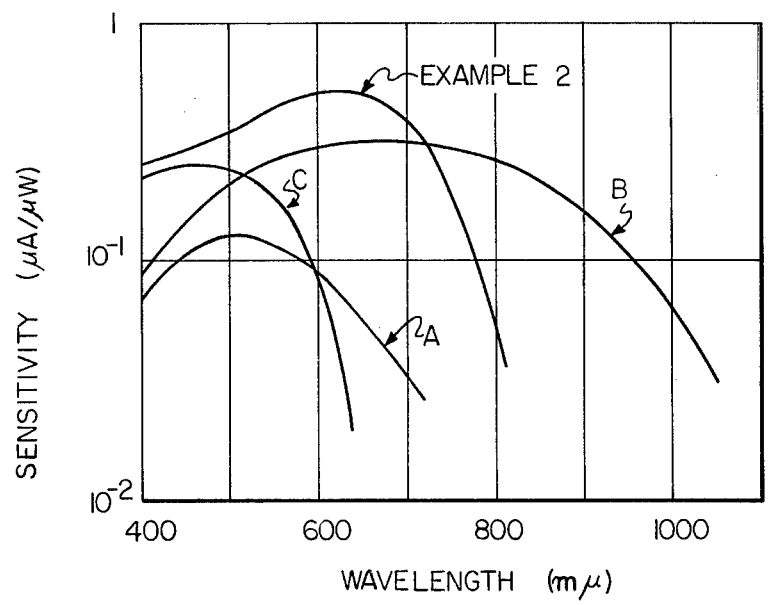
FIG. 11 is a graph showing the spectrum characteristics of the conventional photoconductor elements and that of the Example 2 in accordance with the present invention.

Table 3 and FIG. 11 show the comparison of the characteristics of the target in accordance with the present invention and those of targets for prior art two thirds inch image pickup tubes. In FIG. 11, however, only the data with respect to the Example 2 are shown. The prior art target A shown in Table 3, includes a first layer composed of $Zn_{0.9}Cd_{0.1}S$, a second layer composed of $(Zn_{0.7}Cd_{0.3}Te)_{0.95}(In_2Te_3)0.05$ which is formed on the first layer and a third layer composed of $(ZnTe)_{0.99}(In_2Te_3)0.01$ which is formed on he second layer. The detail of the prior art target A is disclosed in The Example 2 of U.S. Pat. No. 3,900,882.

photoconductive element composed of the hetero-junction which is constructed by a film including $Zn_{1-x}Cd_xS$ as an essential component and a film including $(Zn_{1-y}Cd_yTe)_{1-z}(In_2Te_3)_z$ as an essential component, which element was issued as U.S. Pat. No. 3,900,882. The present invention, in comparison, has the photoelectric transducer layer formed on the layer including $An_{1-x}Cd_xS$ as an essential component, and two separate layers such as a CdTe layer and a ZnTe layer doped with In are provided, wherein the second layer of CdTe does not include Zn, resulting in low level of dark current. When Zn is included in the secondary layer of CdTe, number of the energy states in CdTe semiconductor and the surface states at the interface between the first layer and the CdTe layer are increased. As the result, a level of dark current becomes high.

The following part of the description relates to the effect of the temperature of thhe substrate in the process for forming the second layer of CdTe when making this embodiment.

Such substrate-temperature is maintained at within the range of 150° C to 350° C. The basis for such definition of the lower temperature limit is that at the temperature below 150° C, reproducibility is poor at a level of dark current of the obtained element and also the value of dark current is high. Further, it was observed that at near room temperature, the deposited film peeled off the glass substrate. The basis for the upper temperature limit of 350° C is that at the temperature above 350° C, the difference of the obtained layer thickness between at the center portion of the substrate and the peripheral portion of the same is so great that it is difficult to obtain uniform properties over the whole plane of the substrate. Further it is difficult to obtain a sufficient thickness of layer at high substrate-temperature.

Figure 12:
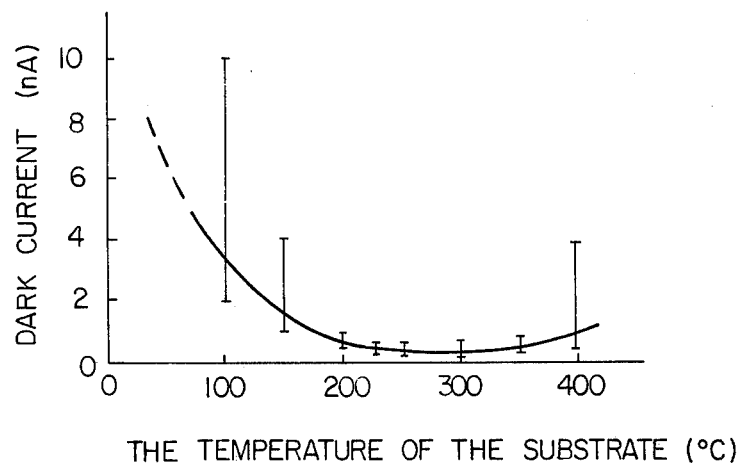
FIG. 12 is a graph illustrating the relationship between a substrate temperature for depositing the Cd Te film of the Example 1 on the first layer and the dark current of thus made photoconductor element.

In FIG. 12, there is shown the relation between the value of dark current of the obtained element and the temperature of the substrate in the process of making the second layer of CdTe according to the example 1, with scattering between samples being shown together therein. Especially at the substrate-temperature within the range of 200° C to 300° C, the obtained film had Table 3

|  | PRIOR ART TARGET | | | | TARGET OF THE PRESENT INVENTION | | | |
|---|---|---|---|---|---|---|---|---|
|  | $Sb_2S_3$ Target | Si Target | PbO Target | Prior art target A | Example 1 | Example 2 | Example 3 | Example 4 |
| Target voltage (V) | 35 | 15 | 40 | 20 | 18 | 20 | 20 | 18 |
| Dark-current (nA) | 20 | 8 | 0.3 | 1.0 | 0.5 | 0.8 | 0.8 | 0.8 |
| Sensitivity (μA/lm) | 300 | 3400 | 380 | 2240 | 2750 | 3100 | 3000 | 2600 |
| Blue sensitivity 400μ(μA/μW) | 0.05 | 0.1 | 0.15 | — | 0.23 | 0.27 | 0.27 | 0.21 |
| Lag-image(%) signal current 200nA. after 3 field. | 25 | 10 | <2 | 12 | 8 | 12 | 12 | 10 |

As will be seen from the Table 3, the target for the image pickup tube embodying this invention is superior to $Sb_2S_3$ target in almost all charcteristics, and is inferior in lag-image property but superior in dark-current and sensitivity in the range of blue light to the Si target. With respect to sensitivity, it is seen from FIG. 11 that the target embodying this invention is superior distinctly to $Sb_2S_3$ target(A), Si target (B) and PbO target(C), in the range of visible light.

Prior to this invention, an inventive entity including some of the inventiors, of this invention invented a uniform thickness and also had a low level of dark current in with excellent reproducibility.

This invention can be applied to a photodetector in an exposure meter, illuminometer and electrophotography, etc. in addition to a trget far on image pickup tube.

What is claimed is:

1. A photoconductor element, which comprises:
   a first layer of a substance having a wider band gap energy layer then CdTe;
   a second layer of a substance primarily consisting of CdTe and deposited on said first layer; and a third layer of a substance primarily consisting of ZnTe containing indium therein and deposited on said second layer.

2. A photoconductor element according to claim 1, wherein said first and second layers and said second and third layers establish hetero-junctions, respectively.

3. A photoconductor element according to claim 1, wherein said first layer primarily consists of ZnSe.

4. A photoconductor element according to claim 1, wherein said first layer primarily consists of $Zn_{1-x}Cd_xS$ wherein $0 < x < 0.3$.

5. A photoconductor element according to claim 1, wherein said second layer contains from 0 to 1 atomic percent of indium.

6. A photoconductor element according to claim 1, wherein said third layer contains from 0.03 to 5 atomic percent of indium.

7. A photoconductor element accoring to claim 3, wherein said second layer contains from 0 to 1 atomic percent of indium.

8. A photoconductor element according to claim 4, wherein said second layer contains from 0 to 1 atomic percent of indium.

9. A photoconductor element according to claim 7, wherein said third layer contains from 0.03 to 5 atomic percent of indium.

10. A photoconductor element according to claim 8, wherein said third layer contains from 0.03 to 5 atomic percent of indium.

11. a photoconductor element according to claim 1, wherein said element further comprises a fourth layer primarily consisting of $Sb_2S_3$ and is formed on the third layer.

12. A photoconductor element according to claim 9, wherein said element further comprises a fourth layer primarily consisting of $Sb_2S_3$ and is formed on the third layer.

13. A photoconductor element according to claim 10, wherein element further comprises a fourth layer primarily consisting of $Sb_2S_3$ and is formed on the third layer.

14. A photoconductor element according to claim 1, wherein the thickness of the second layer is from 0.2 to 0.8 $\mu$m.

15. A photoconductor element according to claim 9, wherein the thickness of the second layer is from 0.2 to 0.8 $\mu$m.

16. A photoconductor element according to claim 10, where the thickness of the second layer is from 0.2 to 0.8 $\mu$m.

17. A photoconductor element according to claim 12, wherein is thickness of the second layer is from 0.2 to 0.8 $\mu$m.

18. A photoconductor element according to claim 13, wherein is thickness of the second layer is from 0.2 to 0.8 $\mu$m.

* * * * *